US009898113B2

(12) United States Patent
Aubry et al.

(10) Patent No.: US 9,898,113 B2
(45) Date of Patent: Feb. 20, 2018

(54) TOUCH CONTROL MODULE

(71) Applicant: DAV, Créteil (FR)

(72) Inventors: Anthony Aubry, Créteil (FR); Stéphane Vanhelle, Créteil (FR); Fabio Pestarino, Créteil (FR)

(73) Assignee: DAV, Créteil (FR)

( * ) Notice: Subject to any disclaimer, the term of this patent is extended or adjusted under 35 U.S.C. 154(b) by 688 days.

(21) Appl. No.: 14/406,639

(22) PCT Filed: Jun. 28, 2013

(86) PCT No.: PCT/EP2013/063616
§ 371 (c)(1),
(2) Date: Dec. 9, 2014

(87) PCT Pub. No.: WO2014/001497
PCT Pub. Date: Jan. 3, 2014

(65) Prior Publication Data
US 2015/0153857 A1 Jun. 4, 2015

(30) Foreign Application Priority Data
Jun. 29, 2012 (EP) .................... 12290214

(51) Int. Cl.
G06F 3/041 (2006.01)
B60K 37/06 (2006.01)
(Continued)

(52) U.S. Cl.
CPC .............. *G06F 3/041* (2013.01); *B60K 37/06* (2013.01); *G06F 3/016* (2013.01); *H03K 17/96* (2013.01);
(Continued)

(58) Field of Classification Search
CPC ........ G06F 3/041; G06F 3/0416; G06F 3/016; Y10T 403/454; Y10T 403/455; Y10T 403/456; Y10T 403/457; B60K 37/06
See application file for complete search history.

(56) References Cited

U.S. PATENT DOCUMENTS 6,354,575 B1  3/2002  Yamashita
2008/0024288 A1  1/2008  Kageyama et al.
(Continued)

FOREIGN PATENT DOCUMENTS

DE       297 22 565 U1   4/1998
DE   10 2010 005 483 A1   8/2010
(Continued)

OTHER PUBLICATIONS

International Search Report for corresponding International Application No. PCT/EP2013/063616, dated Nov. 12, 2013 (2 pages).

*Primary Examiner* — Jonathan Masinick
(74) *Attorney, Agent, or Firm* — Osha Liang LLP

(57) ABSTRACT

Touch control module (13) with haptic feedback destined to be mounted on a control panel (5) of a motor vehicle via at least two fixing lugs (11) and fixation means wherein the fixation means comprise screws (1, 29) fastened to the control panel (5) perpendicular to the outer surface (7) of the control panel (5) for holding the touch control module (13) characterized in that silent blocks (9) are disposed between the fixing lugs (11) and the fixation means in that the fixation means comprise:—spacers (15) for pre-loading longitudinally the silent blocks (9) and,—retention means (17) for holding the spacers (15) in position on the screws (1, 29).

11 Claims, 4 Drawing Sheets

(51) Int. Cl.
*G06F 3/01* (2006.01)
*H03K 17/96* (2006.01)

(52) U.S. Cl.
CPC .. *B60K 2350/1024* (2013.01); *G09G 2300/04* (2013.01); *H03K 2217/96062* (2013.01)

(56) References Cited

U.S. PATENT DOCUMENTS

2010/0053077 A1   3/2010  Huang et al.
2010/0238053 A1   9/2010  Schmidt et al.
2011/0031370 A1*  2/2011  Carnevali ................ B62J 29/00
                                                                                  248/483

FOREIGN PATENT DOCUMENTS

DE      10 2011 104 419 A1   12/2011
WO      WO 03047926 A1 *   6/2003  ........... B60S 1/0488
WO        2012/041417 A1   4/2012

* cited by examiner

TOUCH CONTROL MODULE

BACKGROUND OF THE INVENTION

The embodiments of the present invention refer to a control panel of a motor vehicle and more particularly to a control panel comprising a touch control module with haptic feedback.

Touch control modules are more and more used in the motor vehicle industry in order to replace the mechanical switches. These touch control modules are made of sensors using resistive or capacitive elements which are covered by a protective layer. These sensors are sensitive to the presence of a finger on the protective layer. However, unlike mechanical switches, these sensors do not provide any touch sensitive feedback to inform the user of the switching to a different state. In order to overcome this drawback, haptic feedback elements based for example on piezoelectric, electromagnetic or eccentric rotating mass actuators have been developed. These haptic feedback elements produce a vibration of the protective layer which is transmitted to the finger in contact with the protective layer producing therefore a mechanical feedback to the user when the state of a command is modified.

An issue to overcome with these touch control modules with haptic feedback is the achievement of the alignment of the module outer surface which is the protective layer with the outer surface of the control panel on which the module is mounted whatever the thickness of the control panel. Furthermore, mechanical damping is required between the touch control module and the control panel to avoid the transmission of the vibrations produced by the haptic feedback elements to this control panel. Indeed, it is necessary to align the different elements of the control panel to provide a smooth design for visual and touch effect while it is important to isolate the structure of the control panel from the vibrations to prevent the creation of noise or vibrations that could be annoying for the user.

SUMMARY

It is thus a goal of the present invention to overcome at least partially the above mentioned drawbacks of the state of the art and to propose means for enabling the alignment of a touch control module with the outer surface of a control panel while preventing from the transmission of the vibrations between both elements.

Thus, the embodiments of the present invention refer to a touch control module with haptic feedback destined to be mounted on a control panel of a motor vehicle via at least two fixing lugs and fixation means wherein the fixation means comprise screws fastened to the control panel roughly perpendicular to the outer surface of the control panel for holding the module wherein silent blocks are disposed between the fixing lugs and the fixation means in that the fixation means comprise spacers for pre-loading longitudinally the silent blocks and retention means for holding the spacers in position on the screws.

According to another aspect of the present invention, the spacers with the silent blocks and the retention means are mounted directly on the screws.

According to a further aspect of the present invention, the retention means are springs disposed between the control panel and the spacers.

According to an additional aspect of the present invention the retention means are locknuts set against the spacers.

According to another aspect of the present invention, the retention means are made by a threaded spacer.

According to a further aspect of the present invention, an O-ring joint is disposed in between the module and the control panel.

According to an additional aspect of the present invention, the spacer comprises a first end destined to be in contact with a screw head and a second end destined to be in contact with the retention means, the height of the spacer being determined so that a pre-load of 10% is apply on the silent block when the spacer is in contact the screw head.

According to another aspect of the present invention, the silent blocks are made of elastomer or silicone.

The embodiment of the present invention also refer to a control panel of a motor vehicle comprising at least one touch control module.

According to another aspect of the present invention, the structure of the control panel is made of molded zamak and is covered of a decorative foil.

The embodiments of the present invention also refer to a motor vehicle comprising a control panel.

In these drawings, the elements having the same reference correspond to elements having the same function

DETAILED DESCRIPTION OF THE INVENTION

As used herein, the term "silent block" refers to a small piece of soft material such as elastomer which are used to damp the vibrations between two structures.

As used herein the term "Zamak" refer to an alloy of zinc (around 95%), aluminium (around 95%), magnesium (around 0.03%) and possibly copper (around 1%).

The embodiments of the present invention refer to a control panel comprising touch control module with haptic feedback destined to installed in a motor vehicle, for example as a front panel. The touch control module comprises fixing lugs located on the sides of the module in order to enable the module to get attached to the structure of the control panel. The number of fixing lugs depends on the size and the weight of the module but at least two fixing lugs are required in order to hold the module in position correctly. The fixing lugs comprise a hole or a notch to receive the fixation means and a silent block. The size of the hole or notch is determined according to the size of the silent block.

Figure 1:
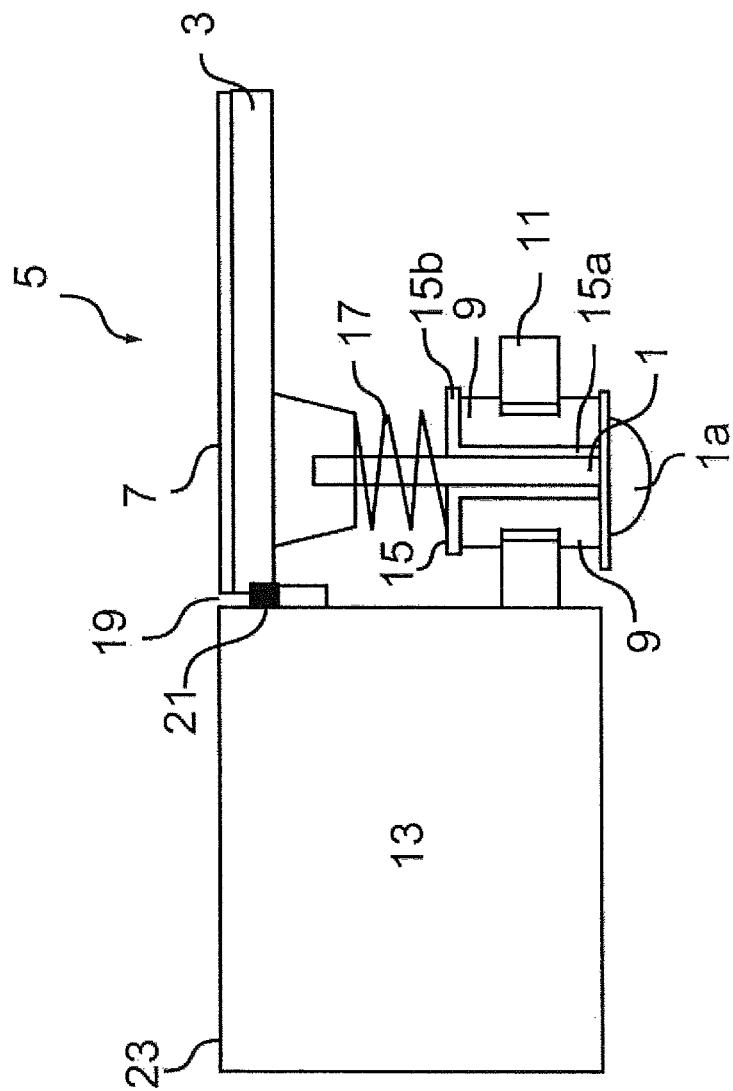
FIG. 1 is a diagram of the fixation of a touch control module to a control panel according to a first embodiment of the present invention

According to a first embodiment represented in FIG. 1, the fixation means comprise a screw 1 which is fastened to the structure 3 of the control panel 5. The structure 3 of the control panel 5 is generally made of plastic or molded zamak. Furthermore, the structure is usually covered of a decorative foil 7 on its outer surface. This decorative foil may be a plastic, a wood or a carbon foil or real glass and may be varnished. A silent block 9 is positioned between the fixing lug 11 of the touch control module 13 and the fixation means in order to damp the vibrations produced by the module 13. The silent block 9 is made by a piece of elastomer, for example a urethane, and has a cylindrical shape. The outer diameter is smaller at the center of the cylinder than at the borders and the height of the center matches with the thickness of the fixing lug 11 in order to maintain the silent block 9 in position in the fixing lug 11. The fixation means comprise also a spacer 15, for example a piece of aluminium, which comprises a first part 15*a* made of a thin cylinder with an inner diameter corresponding to the diameter of the screw 1, an outer diameter corresponding to the inner diameter of the silent block 9 and a second part 15*b* having a disc shape located at a first extremity of the first part 15*a*. The parts 15*a* and 15*b* may be either two separated pieces or a single piece. The fixation means comprise also retention means 17, for example a spring 17, for holding the spacer 15 in position along the screw 1. Indeed, during the assembly, the spacer 15 is first introduced within the silent block 9 and then positioned on the screw 1 so that the first extremity of the spacer 15 is placed at the opposite side of the screw head 1*a* and so that the silent block 9 is in contact with the screw head 1*a*. The spring 17 is then position on the screw 1 and comes in contact with the second part 15*b* of the spacer 15. Thus, when the screw 1 is tightened on the structure 3 of the control panel 5, the spring 17 and the silent block 9 get compressed. The compression of the silent block 9 is limited by the spacer 15 and the height of the spacer 15 is determined so that the compression of the silent block 9 correspond for example to a longitudinal pre-load of 10% when the second extremity of the spacer 15 is in contact with the screw head 1*a*. The spring rate is chosen to ensure that the spacer 15 is in contact with the screw head 1*a*. Indeed, the pre-load of 10% enables a better damping of the vibrations so that the spring rate needs to be higher than the silent block 9 stiffness.

Besides, as the module 13 and the structure 3 of the control panel 5 have to be mechanically disconnected to avoid the transmission of the vibrations, there is a gap 19 at the interface between the module 13 and the control panel structure 3. However, such gap 19 may be unaesthetic for the user so that an O-ring joint 21 is disposed all around the module 13 between the module 13 and the structure 3 of the control panel 5. Furthermore, such O-ring joint 21 enables to have a module 13 that is centered with a regular clearance along the circumference of the module 13 and prevents from a possible shock between the module and the control panel structure 3.

Thus, as the screw (1) is screwed roughly perpendicularly to the outer surface 7 of the control panel 5, by tightening more or less the screw 1 to the control panel structure 3, the position of the module 13 with respect to the control panel structure 3 may be adjusted in order to obtain the alignment of the outer surface 23 of the module 13 and the outer surface 7 of the control panel 5. The outer surface 23 of the module 13 corresponds to the surface on which the user puts his finger.

Besides, instead of a spring 17, a locknut can be used as a retention mean to set the spacer 15 in position against the screw head 1*a*. The spacer 15 may also be threaded and fastened on the screw 1 so that the spacer 15 becomes the retention mean.

Figure 2:
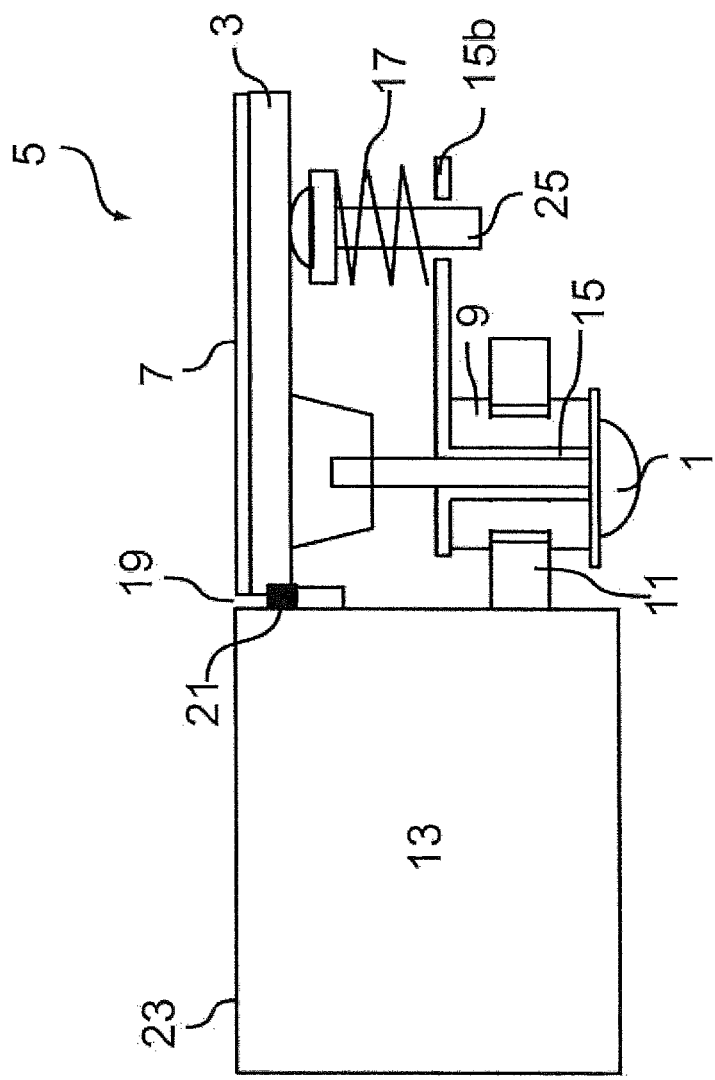
FIG. 2 is a diagram of the fixation of a touch control module to a control panel according to a second embodiment of the present invention

According to a second embodiment represented in FIG. 2, the module 13, the screw 1 and the silent block 9 remain the same but the spacer 15 has a shape wherein the second part 15*b* extends outward off the axis on one side to create a flat support. The flat support comprises a hole destined to receive an axis 25, for example a bolt 25 which is set between the control panel structure and the flat support of the spacer 15, the bolt head being on the control panel structure side. The retention means such as the spring 17 are mounted on this bolt 25 and lie between the bolt head and the flat support of the spacer 15 so that the spring 17 exert a pressure on the spacer 15 to hold it in position against the screw head 1*a*.

Figure 3:
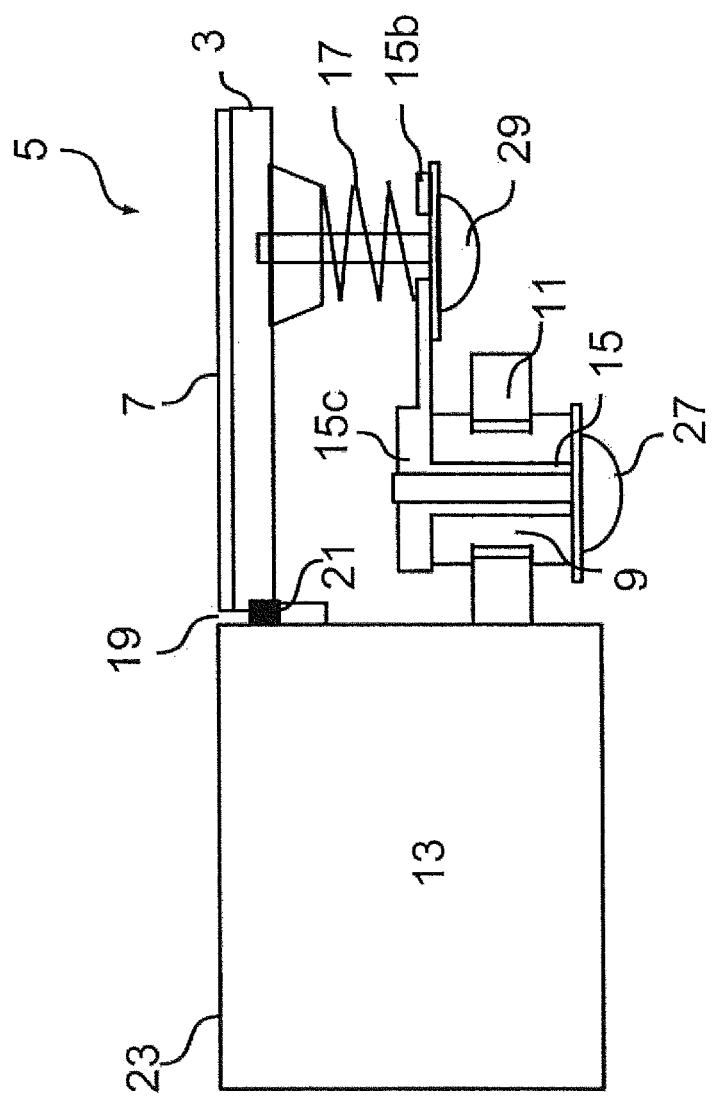
FIG. 3 is a diagram of the fixation of a touch control module to a control panel according to a third embodiment of the present invention

According to a third embodiment represented in FIG. 3, the module 13 and the silent block 9 remain the same as in the first embodiment but the screw 1 is replaced by a shorter screw 27 which is not fastened to the control panel structure 3. The spacer 15 comprises a threaded part 15*c* so that the screw 27 is fasten to the spacer 15. Furthermore, as for the second embodiment, the spacer 15 has a shape wherein the second part 15*b* extends outward off the axis on one side to create a flat support. The flat support comprises a hole destined to receive an axis. The axis is made by a second screw 29 which is fastened to the control panel structure 3, the retention means such as the spring 17 being mounted on the second screw 29. The adjustment of the module 13 position with respect to the control panel structure 3 is then achieved by tightening more or less the second screw 29.

Figure 4:
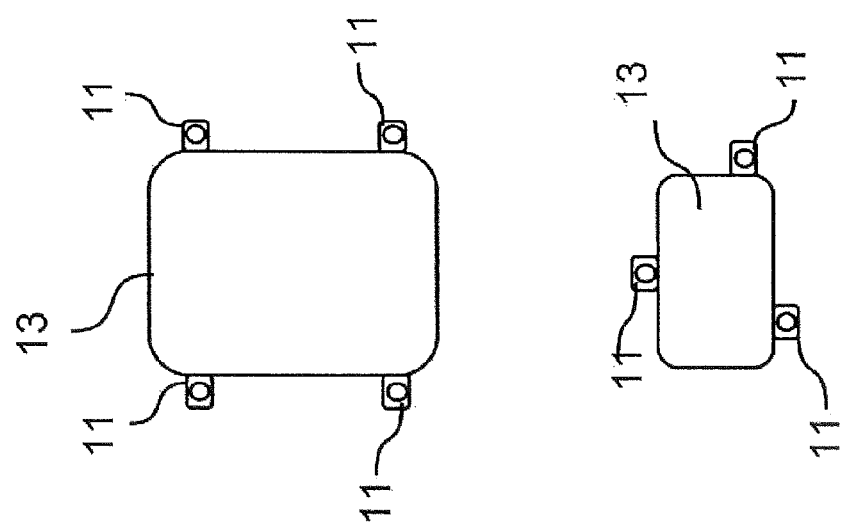
FIG. 4 is a diagram of four touch control modules.

FIG. 4 represents an embodiment of two touch control modules 13 with haptic feedback, one having a small size and one having a large size. The small-size modules comprise three fixing lugs 11 whereas the large-size modules comprise four fixing lugs 11. The fixing lugs are distributed to be approximately equally spaced from each other on the circumference of the modules so that the modules are held correctly and so that the damping of the vibrations is equally distributed between the silent blocks associated with each fixing lug 11.

Figure 5:
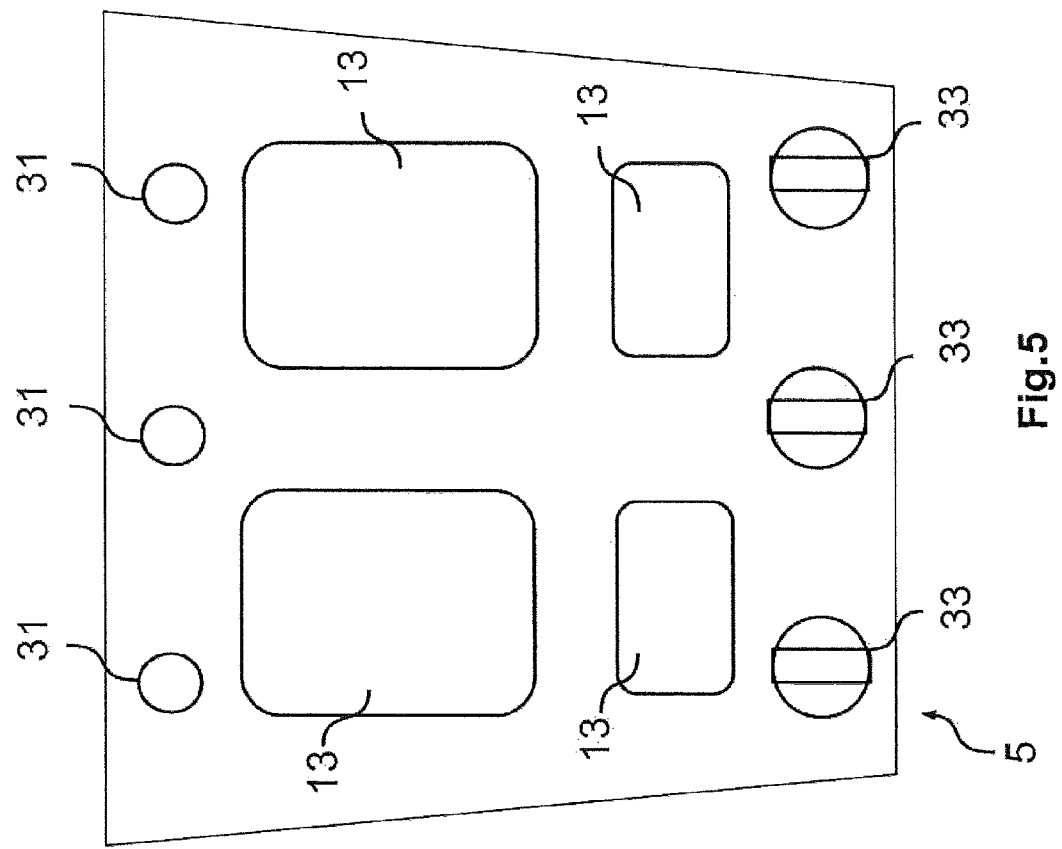
FIG. 5 is a diagram of a control panel comprising a plurality of touch control modules.

FIG. 5 represents an embodiment of a control panel 5 with four touch control modules 13 such as the touch control modules presented in FIG. 4 mounted on the control panel 5. The fixation means presented previously enable to align the outer surface of the modules 13 with the outer surface of the control panel 5 to have a front panel which is smooth. Furthermore the use of the silent blocks 9 and the O-ring joint 21 makes it possible to prevent the transmission of the vibrations produced by the haptic feedback to be transmitted to the structure of the control panel 5. Besides, the control panel may also comprise other control means such as mechanical switches 31 or rotary commands 33.

Thus, the association of the fixation means and the silent blocks according to the embodiments of the present invention make it possible to provide an adjustment of the position of a touch control module comprising an haptic feedback with respect to the control panel to obtain a smooth outer surface while damping the vibrations produced by the haptic feedback to prevent the propagation of these vibration outside of the module.

The invention claimed is:

1. A touch control module with haptic feedback configured to be mounted on a control panel of a motor vehicle via at least two fixing lugs and fixation means, wherein the fixation means comprise:
    screws fastened to the control panel roughly perpendicular to the outer surface of the control panel for holding the touch control module,
    wherein silent blocks are disposed between the fixing lugs and the fixation means, and
    spacers for pre-loading longitudinally the silent blocks and, retention means for holding the spacers in position on the screws.

2. The touch control module in accordance with claim 1, wherein the spacers with the silent blocks and the retention means are mounted directly on the screws.

3. The touch control module in accordance with claim 1, wherein the retention means are springs disposed between the control panel and the spacers.

4. The touch control module in accordance with claim 1, wherein the retention means are locknuts set against the spacers.

5. The touch control module in accordance with claim 1, wherein the retention means are made by a threaded spacer.

6. The touch control module in accordance with claim 1, wherein an O-ring joint is disposed in between the touch control module and the control panel structure.

7. The touch control module in accordance with claim 1, wherein the spacer comprises a first end destined to be in contact with a screw head and a second end destined to be in contact with the retention means, the height of the spacer being determined so that a pre-load of 10% is applied on the silent block when the spacer is in contact with the screw head.

8. The touch control module in accordance with claim 1, wherein the silent blocks are made of elastomer or silicone.

9. A control panel of a motor vehicle comprising at least one touch control module according to claim 1.

10. The control panel of a motor vehicle according to claim 9, wherein the control panel structure is made of an alloy of zinc, aluminum, magnesium, and copper and is covered of a decorative foil.

11. A motor vehicle comprising a control panel according to claim 9.

* * * * *